United States Patent [19]

Denofrio

[11] Patent Number: 4,915,796
[45] Date of Patent: Apr. 10, 1990

[54] ELECTROPLATING PROCESS

[76] Inventor: Charles Denofrio, 117 Oregon Ave., West Dundee, Ill. 60118

[21] Appl. No.: 362,817

[22] Filed: Jun. 7, 1989

Related U.S. Application Data

[62] Division of Ser. No. 258,211, Oct. 14, 1988.

[51] Int. Cl.$^4$ .............................................. C25D 5/02
[52] U.S. Cl. ...................................................... 204/15
[58] Field of Search .......................................... 204/15

[56] References Cited

U.S. PATENT DOCUMENTS 3,798,136 3/1974 Olsen ...................................... 204/15

Primary Examiner—T. M. Tufariello
Attorney, Agent, or Firm—Mathew R. P. Perrone, Jr.

[57] ABSTRACT

A process and an apparatus for coating a printed circuit board in a horizontal position in a coating chamber by flooding the chamber while the printed circuit board is suspended horizontally in a coating chamber between at least two anodes with adjustable power applied to the anodes provides for a uniform coating of the board and the aperture therein.

13 Claims, 4 Drawing Sheets

ELECTROPLATING PROCESS

CROSS-REFERENCE TO RELATED APPLICATION

This application is a divisional application of U.S. patent application Ser. No. 07/258,211 filed Oct. 14, 1988 pending.

BACKGROUND OF THE INVENTION

This application relates to a process and an apparatus for coating a printed circuit board and the resultant board, and more particularly to a process and an apparatus for coating a printed circuit board by (1) securing the board in the horizontal position in a coating chamber, and (2) coating the board by flooding the chamber with a coating solution while applying an electric charge to the printed circuit board.

Where an electric circuit formed by wires has been used in many situations in the past, it is now known that such wiring can cause problems. The printed circuit board can replace the wired circuit and solve these problems. Also in this fashion, the structure of an electrical item is simplified with the use of a printed circuit board.

The raw material for a printed circuit board is a non conductive substrate coated with a conductor or conductors. Generally such substrates are flat fiber glass materials. The first conductive coating applied is copper. Copper may be applied by electroplating, lamination or other suitable fashion.

The copper coated substrates are then covered with a photoemulsion. This photoemulsion permits photographic development of the desired circuitry to expose the copper on the fiberglass board. The photoemulsion is exposed photographically. After exposure, the exposed photoemulsion is washed away as desired, and the copper thereunder is exposed. At that point, the exposed copper can be coated if the circuit is a photographic positive, or etched away if the circuit is a photographic negative.

Assuming a photographic positive, the copper, as desired, can be coated with nickel, gold, or other metals or conductive materials as the next step or steps in making the printed circuit board. Then the remainder of the photoemulsion may be washed away from the copper. To complete the printed circuit board, the copper that is unprotected by nickel and gold—or other suitable metals or conductive material—is removed. Thus, after the exposed copper is coated with nickel and gold, it is possible to rinse off the photoemulsion and etch off the uncoated copper to complete the board.

Assuming a photographic negative, the copper, as exposed, can be etched or otherwise removed from the substrate. Then the remainder of the photoemulsion may be washed away to expose the remaining copper. To complete the printed circuit board, the copper that remains is coated by nickel and gold—or other suitable metals or conductive material.

A plurality of printed circuit boards may be stacked for a desired purpose. When stacked each printed circuit board may be interconnected by apertures in the board or boards. A drill pattern is established for the apertures in the printed circuit board by photoimagery. It is critical to coat the interior of the aperture in the board properly, since the aperture provides the connection from one side of the board to the other or from one circuit to the other. Such coating of the aperture is difficult—especially when reproducibility and uniformity of the board is required for mass production techniques.

It is important to maintain a tight control of the criticality of the coating of the interior portion of the aperture. This is especially true when there is a sandwich or plurality of printed circuit boards available to use. This plurality board increases the size of the printed circuit board sandwich. As the size of the printed circuit board and therefore the number of available circuits increase, the printed circuit boards can be used to replace more wires in a circuit.

The trend and goal in printed circuit boards is to provide a larger board for more circuits with smaller apertures for connecting the circuits. The apertures used to be in the range of two hundred thousandths (0.200 inch) of an inch, which is about five and eight hundredths (5.08) millimeter. (A thousandth of an inch or 0.001 inch is 0.0254 millimeter. One micron is equal one millionth of a meter.) However now the apertures are down to thirty thousandths (0.030 inch) of an inch, which is about 0.762 millimeter and getting smaller.

In a particular case, the aperture has a diameter of eighteen thousandths (0.018 inch or 0.457 millimeter) of an inch. A copper coating on the interior of the aperture reduces the diameter of the hole to fifteen thousandths (0.015 inch or 0.381 millimeter) of an inch. On the copper is desired to put up to two hundred millionths (0.000200 inch) of an inch of nickel and at least fifty millionths (0.000050 inch or 0.00127 millimeter or 1.27 microns) of an inch of gold.

With these smaller apertures it has become extremely difficult to provide the metal coating on the interior thereof. An attempt is made to meet these difficulties with a combination of chemistry and electroplating. Chemical changes involve adjusting the viscosity of the electroplating solution and other actions. However, adjusting the viscosity of solutions and changing that particular coating method destroys the integrity of the solution and makes it extremely difficult to monitor the integrity to achieve the desired coating. Accordingly, it is desired to avoid changes in the coating solution.

It is customary to coat the plates in a vertical fashion in the coating bath. Various methods have been used to achieve equilibrium of the coating. However, due to the depth of solution and the differing pressures on the various levels of the board due to the force of the liquid, equal coating contact of the apertures of the apertures with the coating solution is not possible. The unequal pressure due to the differing depths of the liquid at various points on a vertical board causes problems that make reproducibility and uniformity almost impossible.

In the field of solid state printed circuit boards, it is highly desirable to coat within an aperture on the board. It is desired to provide a minimized aperture to surface coating ratio while coating the circuit board to provide various connections and support for the devices. It is also sometimes desirable to stack a number of boards in an appropriate relationship. The stacking of the boards results in a requirement that the interior of apertures throughout a stack of printed circuit boards be coated.

Another possible solution is to move the board to be coated between a spray of the solution. Adjusting of the spray to uniformity combined with positioning the board properly is difficult.

In the manufacture of printed circuit boards, designers are moving toward smaller apertures and thicker boards. For example the aperture sizes are now down to about four thousandths (0.004 inch or 0.1016 millimeter) of an inch and the board thickness is about two hundred fifty thousandths (0.250 inch or 6.35 millimeters) of an inch. The acronym or buzz word used in this matter is HARP, High Aspect Ratio Plating. While the demand for these HARP products is very high, use is limited to research and development prototypes and very low volumes—due to the inability to produce the desired coatings efficiently. Even the Japanese are quite limited in their success with this type of coating. Today's technology is not adequate in equipment or coating solutions or other chemistry to achieve the desired coating results.

This especially desired high aspect ratio plating is critical. The ratio is determined by measuring the diameter of the hole to the board thickness. The lower this ratio, the more difficult it is to coat the interior of the hole. Thus, the failure to coat the hole properly renders the board inoperable. It is highly desired to coat the board and the interior of the aperture in a suitable fashion.

Various attempts are made to achieve this desired coating. One common attempt involves adjusting the vicosity of the liquid. However, viscosity adjustments can only take the coating only so far. With the viscosity adjustments, the coating process and solution often lose the effectiveness of the coating. It is desired that an adequate supply of fresh solution for coating the board should be applied uniformly and with equal pressure.

The application of the desired coatings in the prior art manner is proven difficult, with the coatings having insufficient uniformity to comply with the desired results. It is therefore highly desired to achieve a coating process and resultant article within the desired parameters of thickness and uniformity with reproducibility.

SUMMARY OF THE INVENTION

Therefore, it is an objective of this invention to provide an apparatus for coating a printed circuit board.

A further objective of this invention is to provide an apparatus for coating an aperture in a printed circuit board.

A still further objective of the invention is to provide an apparatus for tightly controlling the coating of an aperture in a printed circuit board.

Yet a further objective of the invention is to provide an apparatus for a large printed circuit board.

Also an objective of this invention is to provide an apparatus for coating a small aperture in a printed circuit board.

Another objective of this invention is to provide an apparatus for coating a small aperture in a printed circuit board uniformly.

Still another objective of this invention is to provide an apparatus for coating a small aperture which minimizes viscosity adjustments in an electrolyte used to coat a printed circuit board.

Yet another objective of this invention is to provide an apparatus which avoids the vertical coating of a printed circuit board.

A further objective of this invention is to provide an apparatus which avoids the spray coating of a printed circuit board.

A still further objective of this invention is to provide an apparatus for coating an aperture in a printed circuit board in a repeatable fashion.

Yet a further objective of the invention is to provide an apparatus for coating a printed circuit board within a time frame.

Also an objective of this invention is to provide an apparatus for coating a printed circuit board within a power frame.

Another objective of this invention is to provide an apparatus for coating a small aperture in a printed circuit board with high aspect ratio plating.

Still another objective of this invention is to provide an apparatus for coating a small aperture in a stack of printed circuit boards.

Yet another objective of this invention to provide a process for coating a printed circuit board.

A further objective of this invention is to provide a process for coating an aperture in a printed circuit board.

A still further objective of the invention is to provide a process for tightly controlling the coating of an aperture in a printed circuit board.

Yet a further objective of the invention is to provide a process for a large printed circuit board.

Also an objective of this invention is to provide a process for coating a small aperture in a printed circuit board.

Another objective of this invention is to provide a process for coating a small aperture in a printed circuit board uniformly.

Still another objective of this invention is to provide a process for coating a small aperture which minimizes viscosity adjustments in an electrolyte used to coat a printed circuit board.

Yet another objective of this invention is to provide a process which avoids the vertical coating of a printed circuit board.

A further objective of this invention is to provide a process which avoids the spray coating of a printed circuit board.

A still further objective of this invention is to provide a process for coating an aperture in a printed circuit board in a repeatable fashion.

Yet a further objective of the invention is to provide a process for coating a printed circuit board within a time frame.

Also an objective of this invention is to provide a process for coating a printed circuit board within a power frame.

Another objective of this invention is to provide a process for coating a small aperture in a printed circuit board with high aspect ratio plating.

Still another objective of this invention is to provide a process for coating a small aperture in a stack of printed circuit boards.

These and other objectives of the invention (which other objectives become clear by consideration of the specification, claims and drawings as whole) are met by a process and apparatus for coating a printed circuit board, while the printed circuit board is suspended horizontally in a coating chamber between at least two anodes with adjustable power applied to the anodes and thence to the board.

BRIEF DESCRIPTION OF THE DRAWINGS

Throughout the Figures of drawing where the same part appears in more than one Figure of the drawing, the same numeral is applied thereto.

DESCRIPTION OF THE PREFERRED EMBODIMENTS

Figure 1:
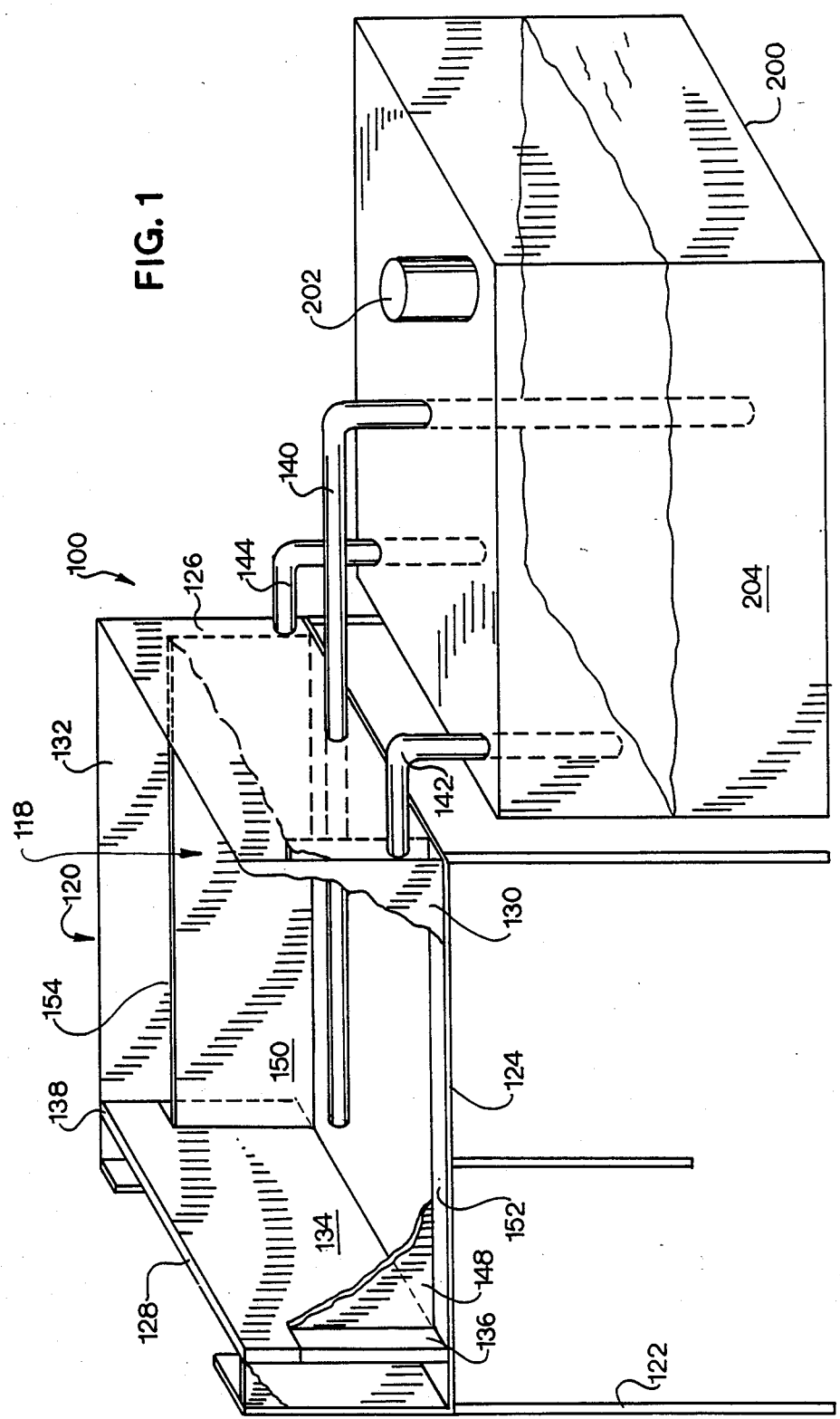
FIG. 1 is a perspective view of the horizontal electroplating apparatus 100 of this invention.

The printed circuit board is a replacement for wire circuits. A drill pattern is established to provide apertures in the printed circuit board by photoimagery. It is critical to coat the aperture in the board properly, because the aperture provides the connection from one side of the board to the other or from one circuit to the other. It is important to maintain a tight control of the criticality of the coating of the interior portion of the aperture. This is especially true when there is a sandwich or plurality of printed circuit boards combined to make many circuits available. As the size of the printed circuit board increases, the printed circuit boards can be used to replace more wires in a circuit.

The trend in printed circuit boards is to provide a larger board for more circuits with smaller apertures for connecting the circuits. To form the printed circuit board, a copper sheet or copper coating is applied to a nonconductive, flat substrate for the purpose of making the printed circuit boards. A typical substrate is made of plastic, synthetic resin, fiber glass, or similar material. Key features of the substrate are non-conductivity and stability to temperature and other operating conditions.

The copper coated substrates are then covered with a photoemulsion. This photoemulsion permits photographic exposure to form the desired circuitry to expose the copper on the substrate. After exposure, the exposed photo emulsion is washed away as desired and the circuit is exposed. The circuit of exposed copper as desired can be coated with nickel and gold or another suitable metal or metals for making the printed circuit board. The remainder of the photoemulsion, whether exposed or unexposed, may be washed away followed by etching of the copper that is unprotected by nickel and gold.

Alternatively, the exposed copper is removed by etching or other suitable methods after rinsing off the exposed photoemulsion. Then, after the rest of the photoemulsion is rinsed off, the then exposed copper is coated with nickel and gold.

Coating with nickel and gold is done electrolytically with the gold being applied over the nickel. The time and the electric power applied relates to the thickness of the coating. Additionally, the rate of pumping of the solution through the printed circuit board has an effect. The particular apparatus may have an adjustable power source, an adjustable circuit board holding mechanism, and a device to adjust the positioning of the anode. Once an appropriate time frame and power frame is determined for accomplishing the coating, the board may be reproduced almost automatically.

It is desired to coat these apertures with up to three hundred microns of nickel. More preferably, it is desired to coat these apertures with up to two hundred fifty microns of nickel and fifty microns of gold. The two hundred fifty microns of nickel is usually the maximum desired. Most preferably, it is desired to coat these apertures with up to two hundred microns of nickel.

Furthermore, it is desired to coat these apertures with at least twenty microns of gold. More preferably, it is desired to coat these apertures with at least thirty microns of gold. Most preferably, it is desired to coat these apertures with at least fifty microns of gold. There is no maximum for microns of gold coating, except that the aperture remain available and open. With the invention described herein, the process and apparatus are now available to achieve this coated printed circuit board—especially on a desirable and repeatable basis, unavailable until the invention herein.

The problem of achieving a repeatable product can be overcome by maintaining a fresh supply of coating solution (or electrolyte) or metal ions in the apertures while at the same time closely controlling the circuitry. (Coating solution and electrolyte are interchangeable terms.) By having the coating solution at a constant pressure through the apertures, desired results are achieved. A surface result of at least 2 to 1 surface coating to aperture center must be achieved. More preferred is a surface result of at least 3 to 1 surface coating to aperture center must be achieved. Most preferred is a surface result of at least 4 to 1 surface coating to aperture center must be achieved.

It is possible to achieve this result by sealing the board in a frame with a substantially horizontal position in a coating chamber. The board is substantially centrally located in the coating chamber between two anodes. The anode selection depends on the desired coating and electrolyte used.

The board chamber is pressurized by flowing the coating solution into the coating chamber from below the board. The other side of the coating chamber above the printed circuit board fills with the coating solution as the coating solution flows into the sealed chamber topped by the board and through the apertures in the board. The electrolyte flows through the apertures in the board and overflows the coating chamber in a continuously recirculating design. In this fashion, the pressure of the coating solution is constant throughout the board. This procedure avoids the use of agitation and the problems inherent therein.

It is possible that the coating solution may contain very fine particles that could plug the apertures in the board. In the particular process described, the board does not move through the solution and the fine particles settle out of the solution as the solution is pumped upwardly through the board. Because the board in its horizontal position seals a lower portion of the coating chamber, the vertical pressure of the electrolyte drives the coating solution through the apertures and provides even pressure over the surface of the board. The out gasing of the coating solution flows upwardly. The recirculated electrolyte passes through a filter to remove fine particles therein as small as one micron.

The current applied to the board can be adjusted to form the desired amount of coating onto the printed circuit board from the electrolyte or coating solution by a potentiometer or similar device. Anodes are positioned above and below the printed circuit board and the amount of current flowing can be adjusted to achieve the desired results.

With this system, the coating solution in the tank can be used at least 8 to 12 times before it must be replaced. Actually, the coating solution may be used up to fifty times before replacement. In some cases, the coating solution may be used 100 or more times before replacement. A quality control check on the printed circuit board, or standard testing of the solution determines when to replace the solution. This use factor is vastly superior to the use rates of the highly doctored electrolyte required by the prior art.

The coating solution or electrolyte most preferably fills the coating chamber in less than one minute to achieve the desired pressure and even coating. If this is accomplished, the coating pressure can be greatly reduced. It is possible to achieve an appropriate coating at low pressures and flow rates. In this apparatus, the flowrate creates the pressure due to the sealing position of the board.

For example, a pressure on the board of one pound per square inch (70.3 grams per square centimeter) is produced by a flow rate of electrolyte into the coating chamber below the board of five gallons (18.9 liters) per second. It is preferred that the flow rate be at least five liters per second and the pressure be at least 18.5 grams per square centimeter. It is more preferred that the flow rate be at least ten liters per second and the pressure be at least 37 grams per square centimeter. It is most preferred that the flow rate be at 15 to 50 liters per second and the pressure be 54 to 185 grams per square centimeter. With the pressure thus produced in the chamber, it is required that the liquid flow through the apertures.

The printed circuit board may be inserted in the frame in a number of manners. The frame may be hinged in any suitable fashion. The frame may be fixed, and the board be inserted through a gate in the coating chamber. Appropriate lifting of the frame may be achieved with hydraulic mechanisms. Any number of methods may be used to achieve the desired results. Even stacks of boards may be used in the same chamber if the chamber is deep enough.

This process and apparatus can be used to apply repeatable copper coatings, gold coatings, nickel coatings and other metals. All that has to be accomplished is empirically determine the thickness of the coating desired and empirically determine the current desired to achieve that desired coating thickness. In this fashion, there only needs to be a common solution and appropriate adjustment to achieve the desired results.

The time of exposure to coating solution, and the electric power applied relate to the thickness of the coating. Additionally, the rate of pumping of the solution through the printed circuit board has an effect. The particular frame may have an adjustable power source, an adjustable circuit board holding mechanism, and a device to adjust the positioning of the anode. Once an appropriate time frame and power frame is determined for accomplishing the coating, the board maybe reproduced almost automatically.

Referring now to FIG. 1, horizontal electroplating apparatus 100 is shown as including coating tank 120 and reservoir tank 200 operably connected to provide a flow of electrolyte 204 from reservoir tank 200 to coating tank 120 and return. All parts of the apparatus may be made of any suitable material or materials of sufficient for the desired purpose. The materials must be inert to the electrolyte 204 and strong enough to support the other parts of the apparatus 100.

Coating tank 120 is shown as positioned above reservoir tank 200 to provide for gravity return of the overflow coating solution or electrolyte 204 to the reservoir tank 200. The coating tank 120, which is generally in the shape of a hollow, topless rectangular solid, is supported on four legs 122 which are secured to the tank floor 124 for apparatus 100. Tank floor 124 provides for a base. The sides of coating tank 120 include a closed tank rear 126 and an open tank front 128 oppositely disposed from the closed tank rear 126. First tank side 130 is perpendicular to the closed tank rear 126 and the open tank front 128 as is second tank side 132. First tank side 130 and second tank side 132 are oppositely disposed from each other thereby forming a hollow rectangular area suitable for coating.

A sliding door 134 fits into open tank front 138 and provides a liquid tight seal for a coating chamber 118 within coating tank 120. The coating chamber 118 within coating tank 120 is formed in a first part by sliding door 134. Sliding door 134 fits into a first sliding door slot 136 and in a second sliding door slot 138 and forms a substantially liquid proof seal with the printed circuit board 240.

The fluid inlet pipe 140 runs from that reservoir tank 200 into the coating chamber 118. It is pump 202 situated on reservoir tank 200 which forces the electrolyte 204 through fluid inlet pipe 140 into the coating chamber 118.

Coating chamber 118 is basically formed within coating tank 120 by the board mounting assembly 146. Board mounting assembly 146 includes a first support wall 148 and a second support wall 150. First support wall 148 is displaced from first tank side 130 as desired. First support wall 148 is not as tall as coating tank 120 is deep.

Second support wall 150 is oppositely disposed from first support wall 148 and is displaced from but adjacent to second tank side 132. Second support wall 150 is similar in shape to first support wall 148. Between first support wall 148 and first tank side 130 is created first overflow cavity 152. When coating chamber 118 is full, the first overflow cavity 152 can receive electrolyte 204 without displacing any of electrolyte 204 from the coating tank 120 and permit the electrolyte 204 to flow through first fluid return pipe 142 back to reservoir tank 200.

In a like fashion second support wall 150 combines with second tank side 132 to form the second overflow chamber 154. In this fashion, electrolyte 204 is received in second overflow chamber 154 and returned to reservoir tank (storage chamber) 200 through second fluid return pipe 144. Pump 202 is secured in standard fashion to reservoir tank 200 and recycles the electrolyte 204 to the coating chamber 118.

Figure 2:
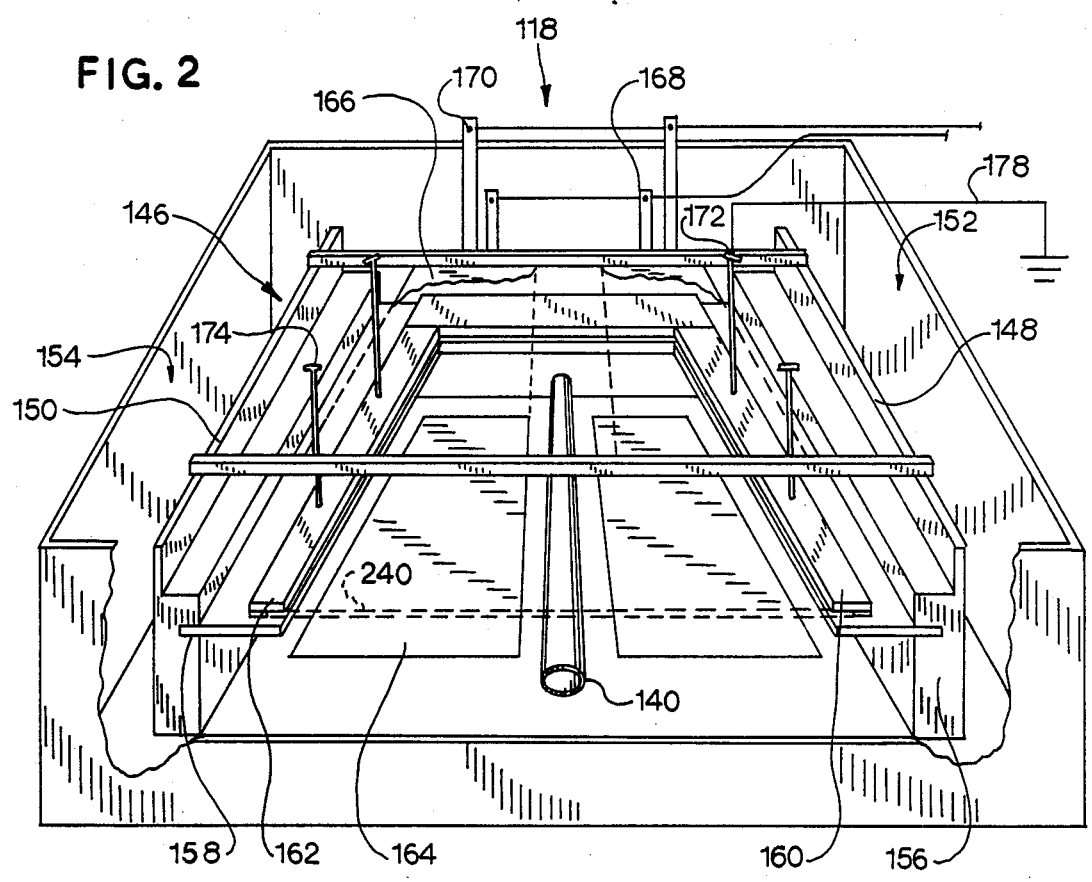
FIG. 2 is a perspective front view of coating tanks 120 as a part of horizontal electroplating apparatus 100.

Referring now to FIG. 1 and FIG. 2, within coating chamber 118 is first board clamp 156 and second board clamp 158. First board clamp 156 appears as a part of first support wall 148. Second board clamp 158 appears as a part of second support wall 150. Within first board clamp 156 is a first board holder 160. Likewise second board clamp 158 includes second board holder 162. First board holder 160 and second board holder 162 provide for a slot to hold the printed circuit board 140 within the coating chamber 118.

Positioned within the coating chamber 118 but below the first board holder 160 and second board holder 162 is a lower anode 164. Above first board holder 160 and second board holder 162 is upper anode 166. Both the upper anode 166 and lower anode 164 are within the coating chamber 118 along with printed circuit board 242.

The first board holder 160 and second board holder 162 provide for the horizontal mounting of the printed circuit board 242 substantially parallel to lower anode 164 and upper anode 166. In this fashion, by providing electrolytes through feed pipe 140, lower anode 164, upper anode 166, and printed circuit board 242 or printed circuit board assembly 240 may be immersed in electrolyte 204. Printed circuit board assembly 240 is a sandwich affair of at least two printed circuit boards 242 interconnected by coating through aperture 254 (shown in FIG. 3). Printed circuit board assembly 240 and printed circuit board 242 may both be coated by this invention and may be used as interchangeable terms.

The lower anode 164 is connected to a lower anode connector 168 which is in turn connected to a potentiometer 176. Likewise the upper anode 166 is electrically connected to upper anode connector 170 which is in turn connected to potentiometer 176 (shown in FIG. 7).

Mounted in first board holder 160 is first cathode assembly 172. Mounted in second board holder 162 is second cathode assembly 174. The anodes and the cathodes combine to provide for electric current to be applied to the printed circuit board 242 as the electrolyte 204 is flowing therethrough to permit the plating to take place. First cathode assembly 172 and second cathode assembly 174 are grounded in any suitable fashion. Wire grounding 178 may be used as shown with first cathode assembly 172. Frame grounding 180 (shown in FIG. 6) by implanted bar 182 in second board holder 162 may also be used.

The cathodes of first cathode assembly 172 and second cathode assembly 174 are more clearly shown in FIG. 2 as is the board holding assembly. It is clear that the electrolyte fluid inlet pipe 140 is positioned below the printed circuit board 242. Preferably the fluid inlet pipe is positioned below the lower anode 164. When assembled, tank floor 124, lower anode 164, upper anode 166 and printed circuit board 242 are substantially parallel to each other and ground level and completely within coating chamber 118 so that all of these elements may be immersed in electrolyte 204. It is the horizontal aspect of this plating that permits coating of the apertures in the most efficient fashion.

Figure 5:
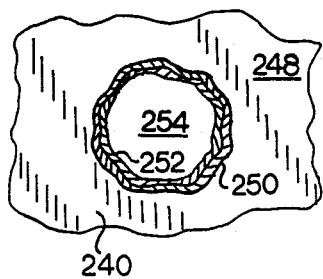
FIG. 5 is a top view of printed circuit board 240 showing aperture 254.
Figure 4:
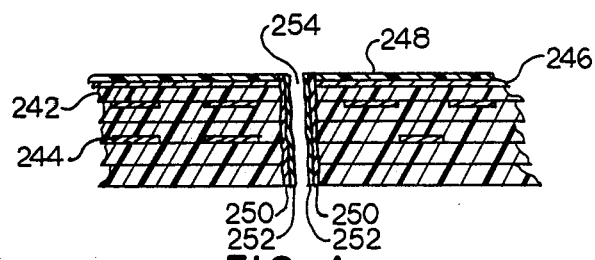
FIG. 4 is a side cut away view of printed circuit board 240 showing aperture 254.
Figure 3:
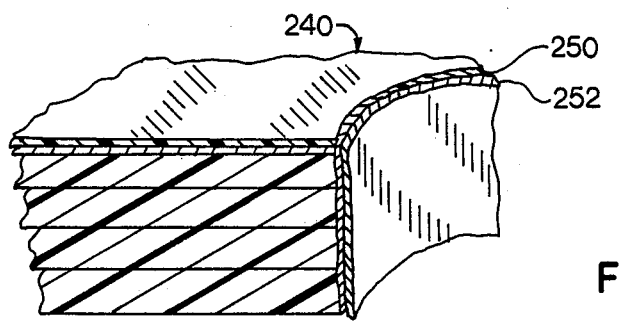
FIG. 3 is a side, perspective cut away view of printed circuit board assembly 240.

Referring now to FIG. 3, FIG. 4, and FIG. 5, a sandwich with a printed circuit board assembly 240 is depicted. Within the printed circuit board assembly 240 are a plurality of printed circuit boards 242. The circuits on printed circuit board 242 generally have a copper layer 246 applied first. As a photoemulsion 248 on top of the copper layer 246 on the printed circuit boards 242 substrate to provide for making of the circuit. The photographic or photoemulsion 248 is exposed to light. The exposed or unexposed emulsion 248 can be washed away. The remaining copper layer 246 can then be etched from the board 242 to form the printed circuit. The apertures 254 in the board 242 provide for the coating and connecting of the various circuits. Nickel 250 or other suitable conductive coating is applied first. This coating is topped by a highly conductive noble metal such as gold 252.

Figure 6:
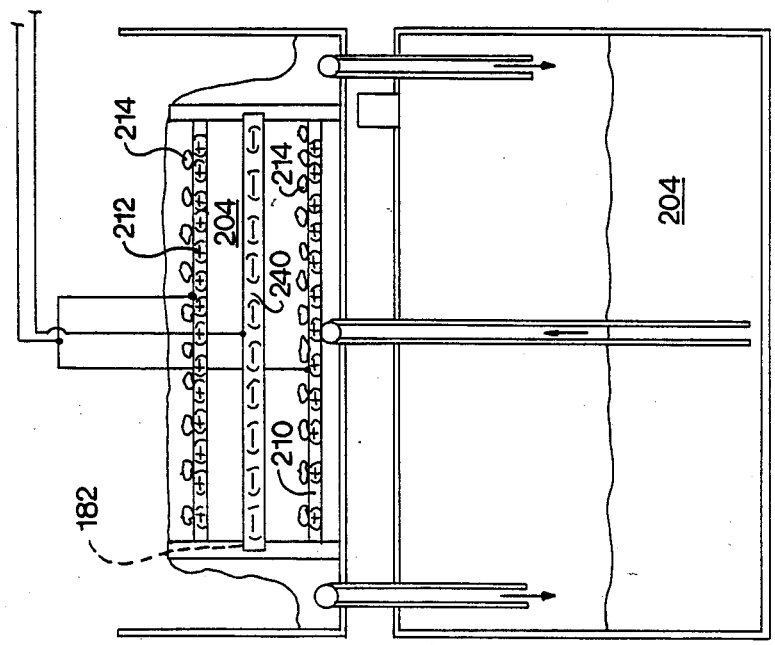
FIG. 6 is an end view in cross-sectional view of electroplating apparatus 100 depicting nickel or similar metal coating.

FIG. 6 depicts the coating of the nickel or similar metals with the appropriate anodes containing the desired metals such as nickel to feed the solution. Assuming for the sake of argument, that nickel is the coating material, lower anode 164 and upper anode 166 (of FIG. 2) are replaced with a lower inert screen 210 and and an upper inert screen 212 respectively. Supported on each of lower inert screen 210 and and upper inert screen 212 are nickel pieces 214. These nickel pieces 214 dissolve in the electrolyte 204 and provides additional coating nickel.

Figure 7:
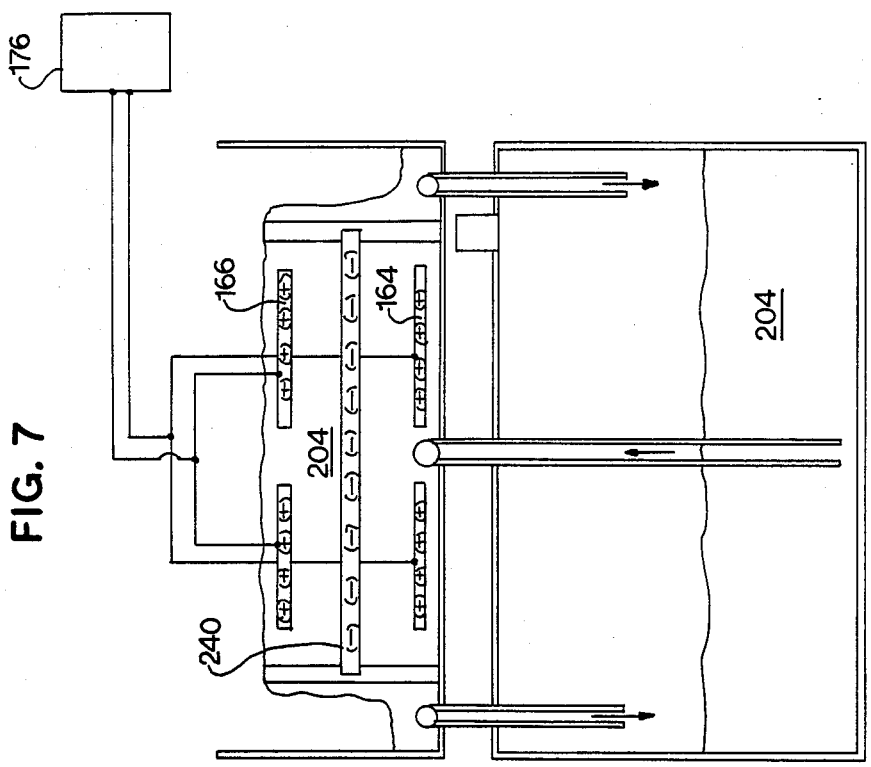
FIG. 7 is a depiction of FIG. 6 providing for noble metal coating.

FIG. 7 depicts an inert anode assembly wherein the plating for printed circuit board assembly 240 is taken entirely from the electrolyte 204. The composition of lower anode 164 and upper anode 166 is basically an inert metal screen with a noble metal coating. Typically, the noble metal preferred for coating lower anode 164 or upper anode 166, when noble metal electroplating is desired, is platinum. The anode in this case does not provide electroplating material.

Figure 8:
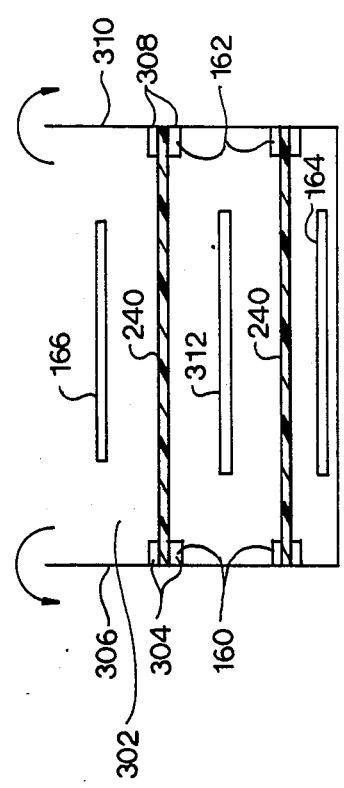
FIG. 8 is a side view of multiple plate coating tank 300 as a modification of horizontal electroplating apparatus 100.

FIG. 8 is a side view of multiple plate coating tank 300 as a modification of horizontal electroplating apparatus 100 and is substantially similar to FIG. 2. Coating chamber 118 of FIG. 2 is the same as multiple coating chamber 302 but for having two units to hold two of printed circuit board assembly 240 in a stacked horizontal arrangement. First multiple board clamp 304 appears as a part of first multiple support wall 306. Second board clamp 308 appears as a part of second multiple support wall 310. Within first multiple board clamp 304 are two of first board holder 160. Likewise second multiple board clamp 308 includes two of second board holder 162.

Positioned within the multiple coating chamber 302, below a lower of printed circuit board assembly 240 is lower anode 164. Above both printed circuit board assemblies 240 is upper anode 166. Between the upper anode 166 and lower anode 164, and the printed circuit boards 242 is middle anode 312—all of these elements being within multiple coating chamber 302 and thus immersible in electrolyte 204. Thus, two of printed circuit board 242 may be coated in one step.

Figure 9:
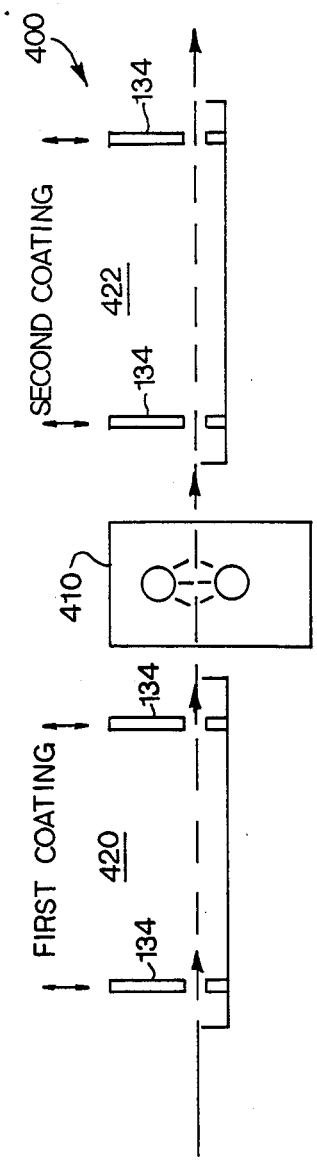
FIG. 9 is a side view of continuous coating tank 400 as a modification of horizontal electroplating apparatus 100.

FIG. 9 is a side view of continuous coating tank 400 as a modification of horizontal electroplating apparatus 100 having a first coating tank 420 and a second coating tank 422. Continuous coating tank 400 differs from coating tank 120 (shown in FIG. 2) in that there two of sliding door 134 shown in FIG. 2 oppositely disposed for a conveyor action of coating. The continuous coating tank 400 may be as numerous as desired as may the coatings applied therein. Clearly first coating tank 420 and second coating tank 422 may apply the same or different coatings. The rinse assembly 410 between each continuous coating tank 400 is optional and used to clean the printed circuit board 242 if desired. It is clear that this process and apparatus may be modified to run on a continuous basis.

The following examples are intended to illustrate without unduly limiting the invention. All parts and percentages are defined by weight of the total composition unless otherwise specified.

EXAMPLE 1

A copper plated fiberglass board coated with a photoemulsion is exposed to a negative of circuit desired on the board. The exposed photoemulsion is washed off. The board is then secured in the apparatus as depicted in FIG. 6. A nickel coating solution (commercially available from ACR, Inc. of Waterbury, Conn., under the name #3,000X) is flowed through the chamber and upwardly through the board while a current of 10 amps is flowed through the board. A uniform coating of nickel is achieved, at about 0.000200 of an inch (or 0.00508 millimeter).

EXAMPLE 2

The board of Example 1 then secured in the apparatus as depicted in FIG. 7. A gold coating solution (commercially available from ACR, Inc. of Waterbury, Conn., under the name ACR 261) is flowed through the chamber and upwardly through the board while a current of 10 amps is flowed through the board. A uniform coating of gold is achieved, at about 0.000051 of an inch (or 0.00130 millimeter).

EXAMPLE 3

A copper plated fiberglass board coated with a photoemulsion is exposed to a negative of circuit desired on the board. The exposed photoemulsion is washed off. The board is then secured vertically in an electroplating apparatus of prior art and coated with nickel using the nickel coating solution of Example 1 while a current of 10 amps is flowed through the board. A non-uniform coating of nickel is achieved.

Connections between various parts of the apparatus disclosed herein are well-known in the art. Hydraulic connections and tank hoses are secured in any standard non-leaking fashion. Hoses, filters, pumps and other parts are mounted as desired, unless a specific mounting place is specified herein.

This application—taken as a whole with the specification, claims, abstract, and drawings—provides sufficient information for a person having ordinary skill in the art to practice the invention disclosed and claimed herein. Any measures necessary to practice this invention are well within the skill of a person having ordinary skill in this art after that person has made a careful study of this disclosure.

Because of this disclosure and solely because of this disclosure, modifications of this method and apparatus can become clear to a person having ordinary skill in this particular art. Such modifications are clearly covered by this disclosure.

What is claimed and sought to be protected by Letters Patent of the United States is:

1. A process for coating of a printed circuit board by electroplating, wherein said process comprises:
    (a) suspending said printed circuit board in a horizontal position in a coating chamber;
    (b) flooding said coating chamber with a coating solution while applying an electric charge to said printed circuit board;
    (c) applying said electric charge to said printed circuit board with at least one upper anode mounted above said printed circuit board and at least one lower anode mounted below said printed circuit board; and
    (d) recovering and recirculating said coating solution.
2. The process for coating of a printed circuit board as set forth in claim 1 wherein:
    (a) said printed circuit board divides said coating chamber into an upper coating chamber and a lower coating chamber; and
    (b) said flooding occurs in said lower coating chamber first with said coating solution passing from said lower coating chamber through at least two apertures in said printed circuit board into said upper coating chamber.
3. The process for coating of a printed circuit board as set forth in claim 2 wherein said at least two apertures are coated first with up to 250 microns of nickel over copper and at least 30 microns of gold over said nickel.
4. The process for coating of a printed circuit board as set forth in claim 3 wherein said at least two apertures are coated first with up to 200 microns of nickel over copper and at least 50 microns of gold over said nickel.
5. The process for coating of a printed circuit board as set forth in claim 4 wherein a surface coating to aperture coating ratio is at least 2 to 1.
6. The process for coating of a printed circuit board as set forth in claim 5 wherein a surface coating to aperture coating ratio is at least 4 to 1.
7. The process for coating of a printed circuit board as set forth in claim 5 wherein said printed circuit board seals said lower chamber and provides for a coating solution pressure through said apertures.
8. The process for coating of a printed circuit board as set forth in claim 2 wherein said recirculated coating solution is filtered.
9. The process for coating of a printed circuit board as set forth in claim 4 wherein said coating solution may be used up to 100 times before replacement.
10. The process for coating of a printed circuit board as set forth in claim 4 wherein a flowrate of said coating solution into said lower chamber is at least five liters per second to create a pressure of at least 18.5 grams per square centimeter.
11. The process for coating of a printed circuit board as set forth in claim 1 wherein said printed circuit board for coating is formed by a photographic process.
12. The process for coating of a printed circuit board as set forth in claim 1 wherein said process is continuous.
13. The process for coating of a printed circuit board as set forth in claim 1 wherein more than one of said printed circuit board is coated in said coating chamber.

* * * * *